(12) United States Patent
Teo et al.

(10) Patent No.: US 7,135,905 B2
(45) Date of Patent: Nov. 14, 2006

(54) HIGH SPEED CLOCK AND DATA RECOVERY SYSTEM

(75) Inventors: Tian Hwee Teo, Singapore (SG); David Seng Poh Ho, Singapore (SG)

(73) Assignee: Broadcom Corporation, Irvine, CA (US)

( * ) Notice: Subject to any disclaimer, the term of this patent is extended or adjusted under 35 U.S.C. 154(b) by 109 days.

(21) Appl. No.: 10/961,201

(22) Filed: Oct. 12, 2004

(65) Prior Publication Data

US 2006/0076993 A1    Apr. 13, 2006

(51) Int. Cl.
*H03H 11/16*    (2006.01)
(52) U.S. Cl. ........................ 327/231; 327/247
(58) Field of Classification Search ............ 327/2, 327/144, 145, 156, 165, 175, 246, 247, 248, 327/231; 375/348, 376, 371; 331/25
See application file for complete search history.

(56) References Cited

U.S. PATENT DOCUMENTS

| | | | |
|---|---|---|---|
| 6,307,696 B1 | 10/2001 | Bishop et al. ............ | 360/51 |
| 6,584,163 B1 | 6/2003 | Myers, Jr. .............. | 375/360 |
| 6,943,606 B1* | 9/2005 | Dunning et al. .......... | 327/231 |
| 2002/0003847 A1 | 1/2002 | Yamamoto et al. ........ | 375/344 |
| 2003/0123589 A1 | 7/2003 | Glenn et al. ............ | 375/354 |
| 2003/0165209 A1* | 9/2003 | Chen et al. ............. | 375/376 |
| 2004/0125823 A1* | 7/2004 | Abhayagunawardhana et al. ...................... | 370/516 |

OTHER PUBLICATIONS

Buchwald et al., "Integrated Fiber Optic Receivers", Kluwar Academic Publishers, pp. 189-196.

Moon et al., "A 62.5-250 MHz Multi-Phase Delay-Locked Loop Using A Replica Delay Line With Triply Controlled Delay Cells", IEEE 1998 Custom Integrated Circuits Conference, pp. 299-302.

Sidiropoulos et al., "A Semidigital Dual Delay-Locked Loop", IEEE Journal Of Solid State Circuits, vol. 32, No. 11, Nov. 1997, pp. 1683-1692.

Kim et al., "Phase Interpolator Using Delay Locked Loop", 2003 Southwest Symposium On Mixed-Signal Design, Feb. 23-25, 2003, pp. 76-80.

Yang et al., "A 0.8-um CMOS 2.5 Gb/s Oversampling Receiver And Transmitter For Serial Links", IEEE Journal of Solid State Circuits, vol. 31, No. 12, Dec. 1996, pp. 2015-2023.

* cited by examiner

*Primary Examiner*—Linh My Nguyen
(74) *Attorney, Agent, or Firm*—Sterne Kessler Goldstein & Fox PLLC

(57) ABSTRACT

A clock and data recovery system for detecting and resolving meta-stability conditions is provided. The clock and data recovery system includes a phase detector having logic configured to detect a meta-stability condition and to generate an output signal to mitigate the condition. The system can also include a time varying gain adjustment portion. This portion includes a gain control logic configured to determine and adjust system gain during reception of an incoming data stream. The system further includes a phase interpolator having increased linearity. The phase interpolator has a plurality of first branches having a differential transistor pair, a switch, and a current source, coupled between a first output and a first supply voltage and a plurality of second branches having a differential transistor pair, a switch, and a current source, coupled between a second output and the first supply voltage. The phase interpolator can also include an integrator portion.

46 Claims, 17 Drawing Sheets

382

| time | gain value |
|---|---|
| 1t | 16 |
| 2t | 8 |
| 3t | 4 |
| 4t | 2 |
| 5t | 1 |
| 6t | 1 |
| . | |
| . | |
| . | |
| Nt | 1 |

| gain value | b5 | b4 | b3 | b2 | b1 | b0 |
|---|---|---|---|---|---|---|
| 1 | s | s | s | s | s | z |
| 2 | s | s | s | s | z | 0 |
| 4 | s | s | s | z | 0 | 0 |
| 8 | s | s | z | 0 | 0 | 0 |
| 16 | s | z | 0 | 0 | 0 | 0 |

FIG. 4

| | 1019A | 1019B | 1019N | Sign | Magnitude | |
|---|---|---|---|---|---|---|
| 1 | 0 | 0 | 0 | 0 | 0 | 1021a |
| 2 | 0 | 0 | 1 | 0 | 1 | 1021b |
| 3 | 0 | 1 | 0 | 1 | 1 | 1021c |
| 4 | 0 | 1 | 1 | 1 | 1 | 1021d |
| 5 | 1 | 0 | 0 | 1 | 1 | 1021e |
| 6 | 1 | 0 | 1 | 1 | 1 | 1021f |
| 7 | 1 | 1 | 0 | 0 | 1 | 1021g |
| 8 | 1 | 1 | 1 | 0 | 0 | 1021h |

| | 1319A | 1319B | 1319N | Sign | Magnitude | Gain Adjust |
|---|---|---|---|---|---|---|
| 1 | 0 | 0 | 0 | 0 | 0 | 0 |
| 2 | 0 | 0 | 1 | 0 | 1 | 0 |
| 3 | 0 | 1 | 0 | 1 | 1 | 1 |
| 4 | 0 | 1 | 1 | 1 | 1 | 0 |
| 5 | 1 | 0 | 0 | 1 | 1 | 0 |
| 6 | 1 | 0 | 1 | 0 | 1 | 1 |
| 7 | 1 | 1 | 0 | 0 | 1 | 0 |
| 8 | 1 | 1 | 1 | 0 | 0 | 0 |

HIGH SPEED CLOCK AND DATA RECOVERY SYSTEM

FIELD OF THE INVENTION

The present invention is generally related to communication devices and in particular to a system and method for recovery of timing information and data for high speed communications links.

BACKGROUND OF THE INVENTION

In the past decade, there has been a dramatic increase both in processor speeds and in memory capacity. As a result, the need for networks to handle high-speed transfer of large quantities of data among devices has also increased. Transceivers capable of efficiently receiving and transmitting high-speed data are critical components of these high-speed networks.

To reliably process a received data signal, a receiver must match its operating characteristics to the characteristics of the received data signal. For example, to minimize data recovery errors, a receiver generates a clock signal to sample the received data signal at times that produce optimal data recovery. To achieve this optimal data recovery, the receiver must lock the sampling clock to the clock of the data transmitter. A clock and data recovery (CDR) circuit in the receiver is a typical circuit used to recover the transmission clock from the received data signal.

Many conventional analog CDR circuits use an analog phase-locked loop (PLL) for frequency and phase acquisition. Analog PLL circuits typically include a phase detector, loop filter, and voltage controlled oscillator (VCO) connected in series. The output of the VCO (i.e., recovered clock) is fed back as an input to the phase detector. The phase detector compares the phase of the input data signal to the phase of the recovered clock and generates an output signal indicative of the phase difference.

These analog PLL circuits have several limitations. Because the circuits typically are implemented using a high order loop and have a loop gain that depends upon the signal transition density, analog PLL circuits are susceptible to instability. Also, because these circuits have unrestrained frequency acquisition characteristics, the circuit may falsely lock to spurious tones and harmonics of the data signal. To address these issues, analog PLL circuits are often implemented using complex circuitry to aid frequency acquisition.

Other conventional CDR circuits use an analog delay-locked loop (DLL) for frequency and phase acquisition. Analog DLL circuits typically include a phase detector (e.g., a Hogge detector), loop filter, and an analog controlled variable delay module consisting of delay elements connected in series. The analog controlled variable delay module receives inputs from a local frequency source and the loop filter. The delay module then produces an output signal (i.e., recovered clock) that is fed back as an input to the phase detector. Because the characteristics of the delay module vary with process, temperature, and supply voltage variations, this type of DLL is difficult to design for mass production and thus, has a limited range of applications.

In addition, analog implementations that allow different loop bandwidths in the acquisition and tracking phase require more complexity than the conventional analog CDRs described above and are still susceptible to degradations caused by process, temperature and voltage variation.

Many conventional digital CDR circuits use a digital DLL including a binary phase detector (also referred to as a 'bang—bang' type phase detector), a phase accumulator, and a phase adjustment element connected in series. These digital CDR circuits are typically used in applications where the synchronization or training sequence preceding transmission of the data payload is long and consists of many cycles. Because the binary phase detector has a high detection gain, a sufficiently small loop bandwidth must be used to prevent large phase jumps in the recovered clock. In the tracking phase, this small loop bandwidth is desirable for rejecting or filtering high frequency cycle-to-cycle type jitter. However, a small loop bandwidth also means a slow response time during the acquisition phase. A slow response time during acquisition limits the use of these DLL circuits in applications where the synchronization sequence preceding the data is restrictively short.

A common implementation of the phase adjustment element of the conventional DLL described above uses tapped delay lines. The overall delay of the circuit is set by a multiplexer that selects one of the delay outputs as the recovered clock. In these implementations, because the phase of the delayed signal cannot be fed back, this type of DLL is restricted to a limited frequency and phase capture range of operation. This limitation is further exacerbated by the fact that the delay in each element varies with temperature, process variation, and power supply voltage. Thus, the ability to obtain adequate phase and frequency capture is made increasingly difficult. Also, for a long tapped delay line, jitter is accumulated as the signal is passed through the numerous delay elements. Thus, if the last few tapped delay lines are used, high self-induced jitter results.

Another potential limitation of using conventional digital or analog CDR circuits, such as those described above, is the possibility that a state could occur such that the phase of the recovered clock is not moved in any direction (referred to as a "dead state" or "meta-stability condition"). A dead state could occur when the synchronization sequence has jitter and duty clock distortion and the clock is not aligned correctly. This effect is undesirable in systems where the number of synchronizations cycles is small and fast acquisition or locking response is required.

Therefore, a need exists for a clock and data recovery system that can detect and rapidly mitigate meta-stability conditions.

A further need exists for a clock and data recovery system that can provide time-varying adjustment of the system gain.

BRIEF SUMMARY OF THE INVENTION

In accordance with aspects of the invention, a clock and data recovery system is provided that can detect and rapidly mitigate meta-stability conditions. The clock and data recovery system includes a sampling module, a phase detector, a gain adjust module, a phase accumulator, and a phase interpolator coupled in series. The output of the phase interpolator is feedback as input to the sampling module. The phase detector includes meta-stability resolution logic that is configured to determine when a meta-stability condition is occurring and to generate an output signal to rapidly mitigate the condition.

In accordance with other aspects of the invention, a clock and data recovery system is provided that has time varying gain adjustment. In this aspect, the clock and data recovery system includes a sampling module, a phase detector, a gain adjust module, a phase accumulator, and a phase interpolator coupled in series between the system input and output and a start of packet detector and a gain control logic module coupled between the system input and the gain adjust module. The start of packet detector detects the start of a preamble associated with an incoming data stream. The gain control logic module determines the value of the system gain during reception of an incoming data stream. In one aspect of the invention, the value of the system gain is based on the number of elapsed time cycles.

In accordance with further aspects of the invention, a phase interpolator having improved linearity is provided. The phase interpolator includes a plurality of first branches, each having a differential transistor pair, a switch, and a current source, coupled between a first output and a first supply voltage and a plurality of second branches, each having a differential transistor pair, a switch, and a current source, coupled between a second output and the first supply voltage. The phase interpolator also includes a first resistance coupled between the second supply voltage and the first output and a second resistance coupled between the second supply voltage and the second output. In a further aspect, the phase interpolator includes a integrator portion coupled to the plurality of first branches and the plurality of second branches.

These and other objects, advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 3 depicts an exemplary table of values of gain values as a function of clock cycles generated by gain control logic module.

FIG. 4 depicts an exemplary table of values for a 6-bit output signal generated by gain adjust module.

Figure 9A:
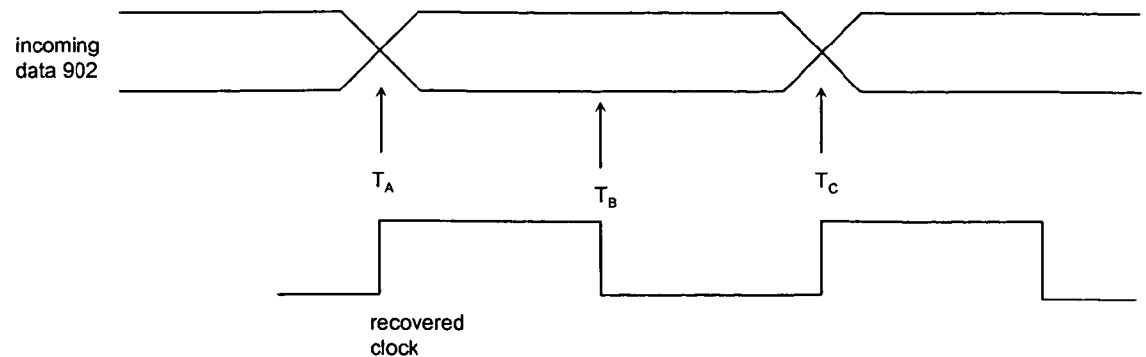
Figure 9B:
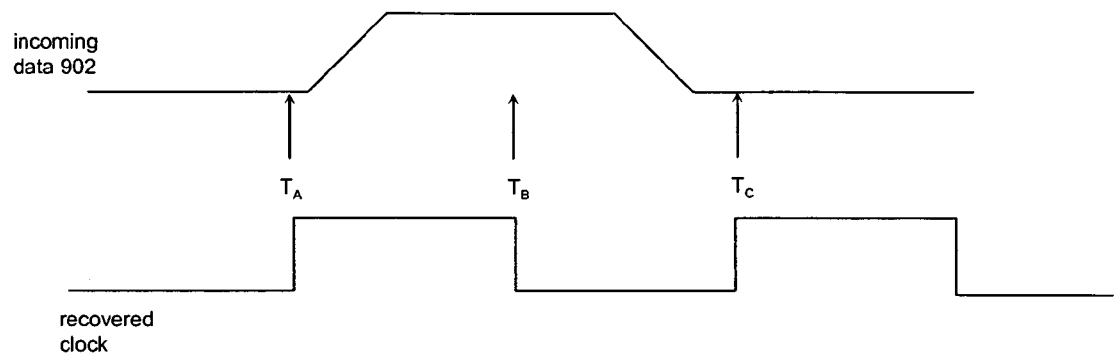
Figure 9C:
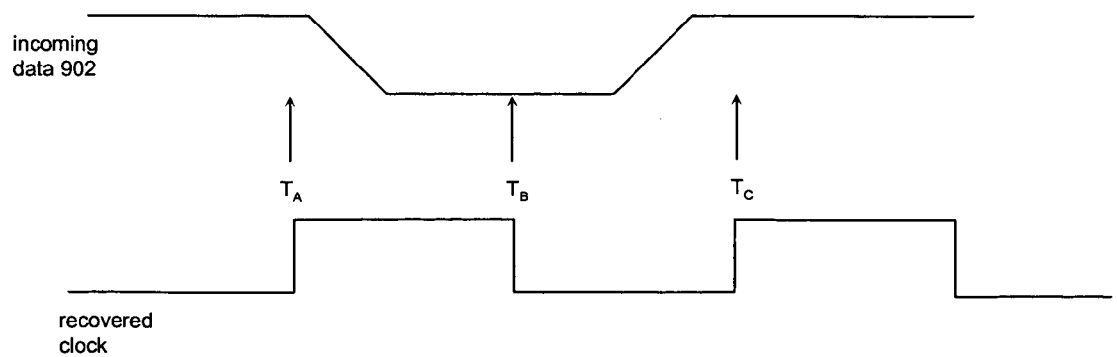

FIGS. 9A, 9B, and 9C depict three exemplary cases illustrating meta-stability conditions.

Figures 10A, 10B:
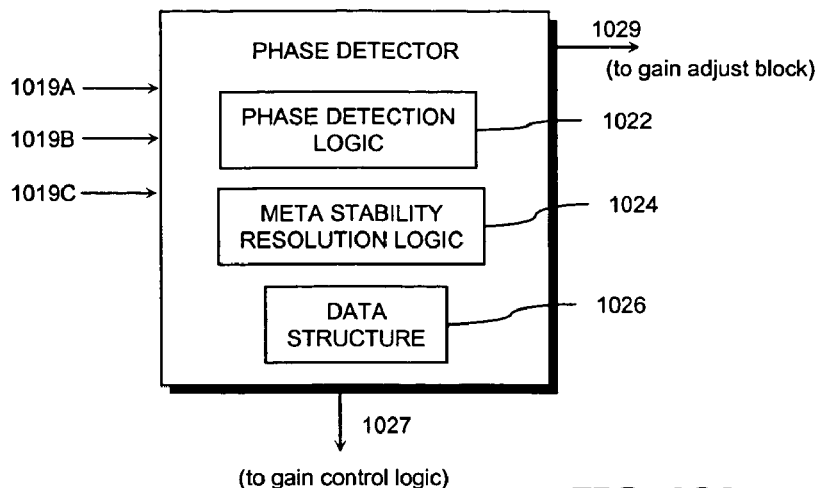

FIG. 10A depicts a phase detector having meta-stability resolution, in accordance with embodiments of the present invention.

FIG. 10B depicts an exemplary data structure, in accordance with embodiments of the present invention.

Figure 11:
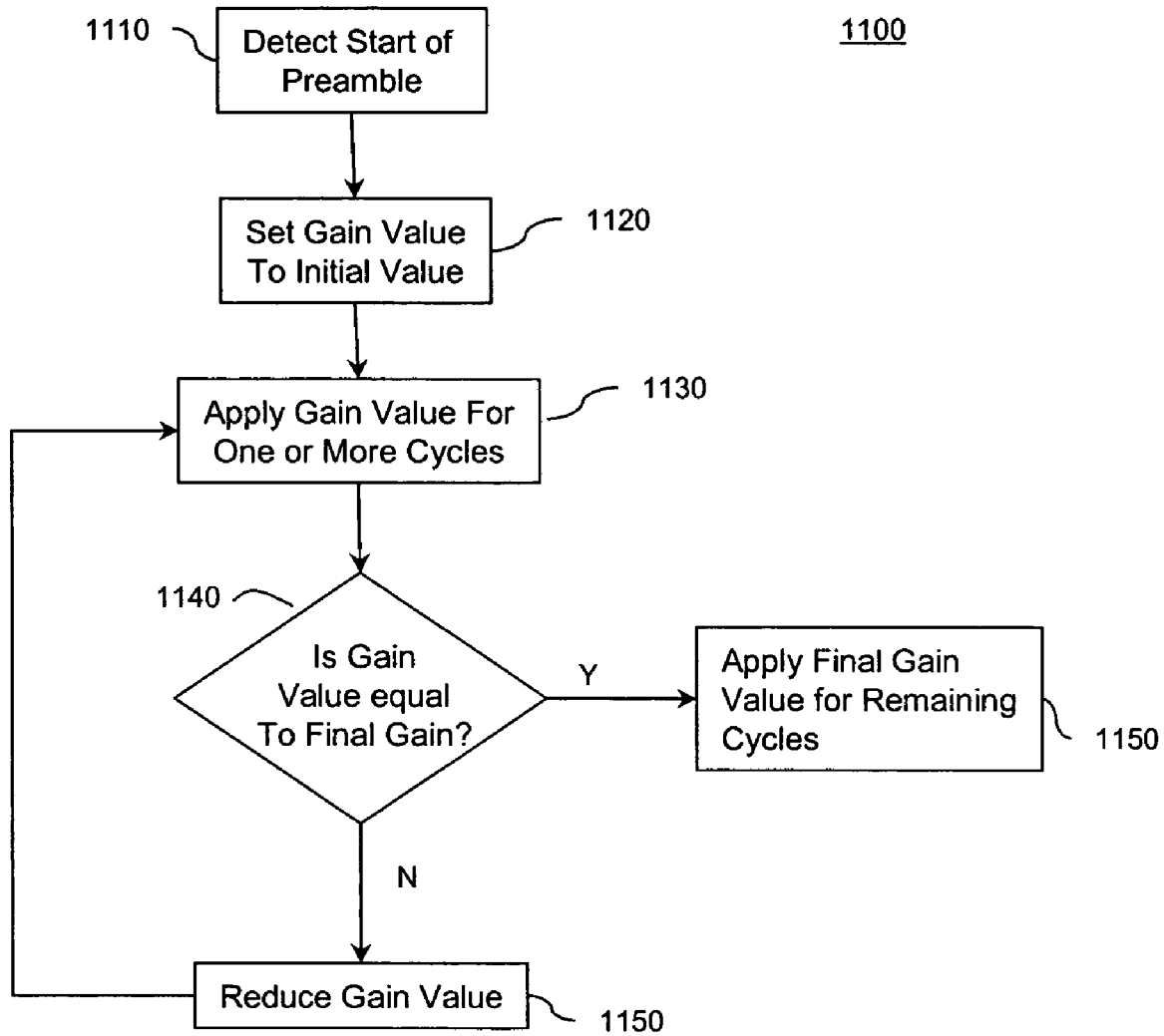

FIG. 11 is a flowchart illustrating a method for time varying gain adjustment in a CDR system.

Figure 12:
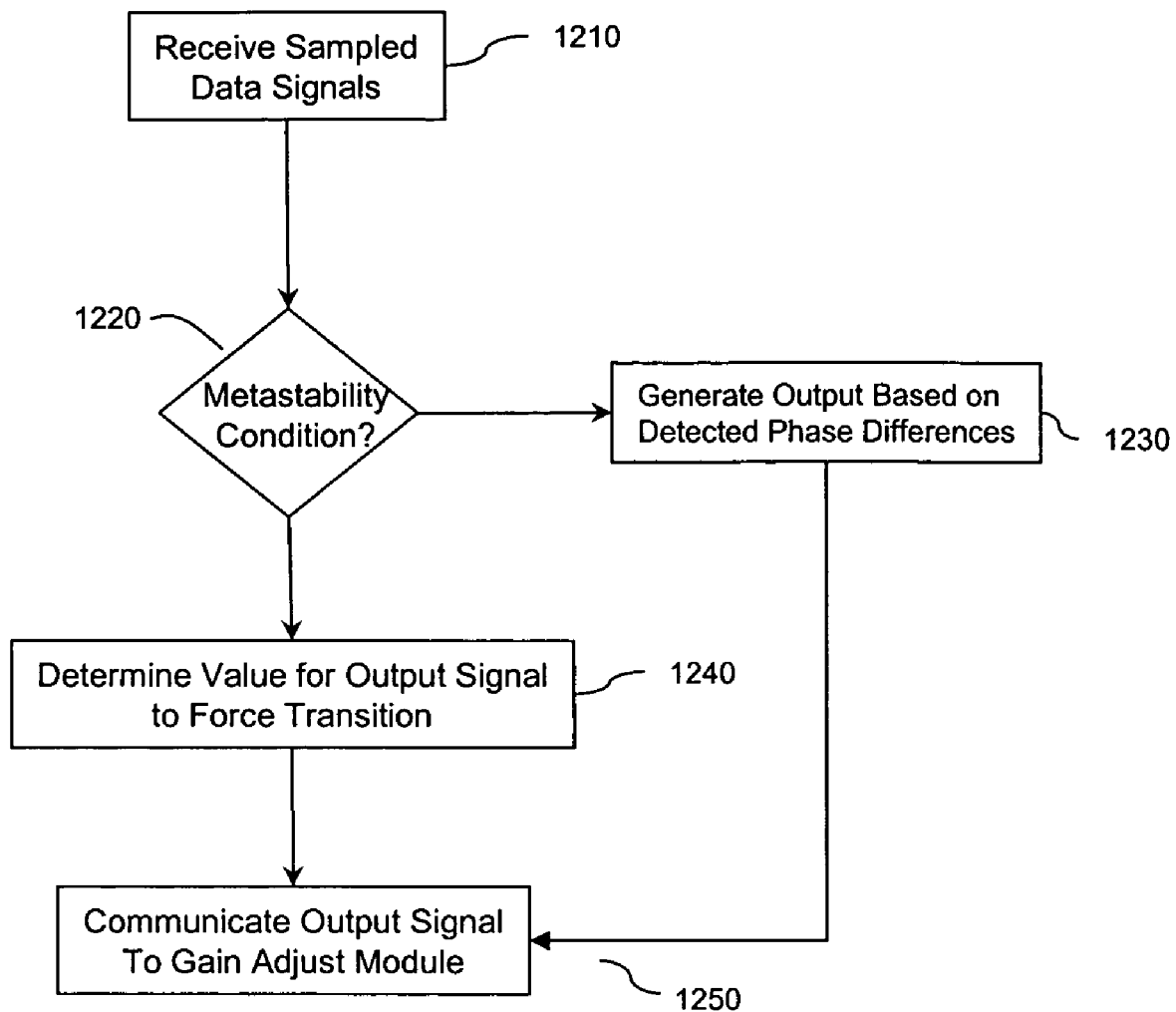

FIG. 12 is a flowchart illustrating a method for meta-stability resolution in a CDR system, according to embodiments of the present invention.

Figure 13A:
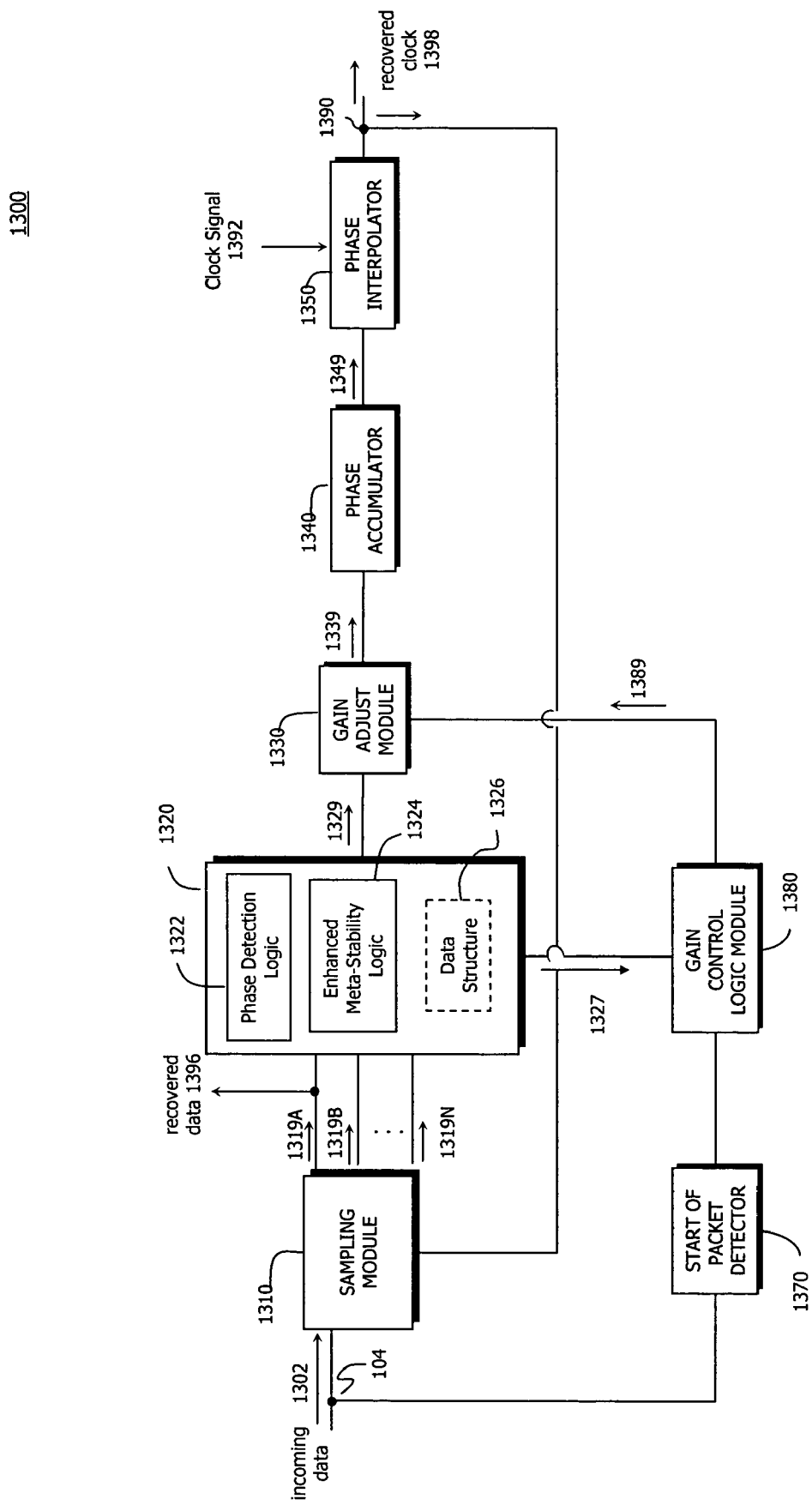

FIG. 13A is a block diagram of a high speed CDR system having enhanced meta stability resolution, according to embodiments of the present invention.

FIG. 13B depicts an exemplary data structure, according to embodiments of the present invention.

Figure 14:
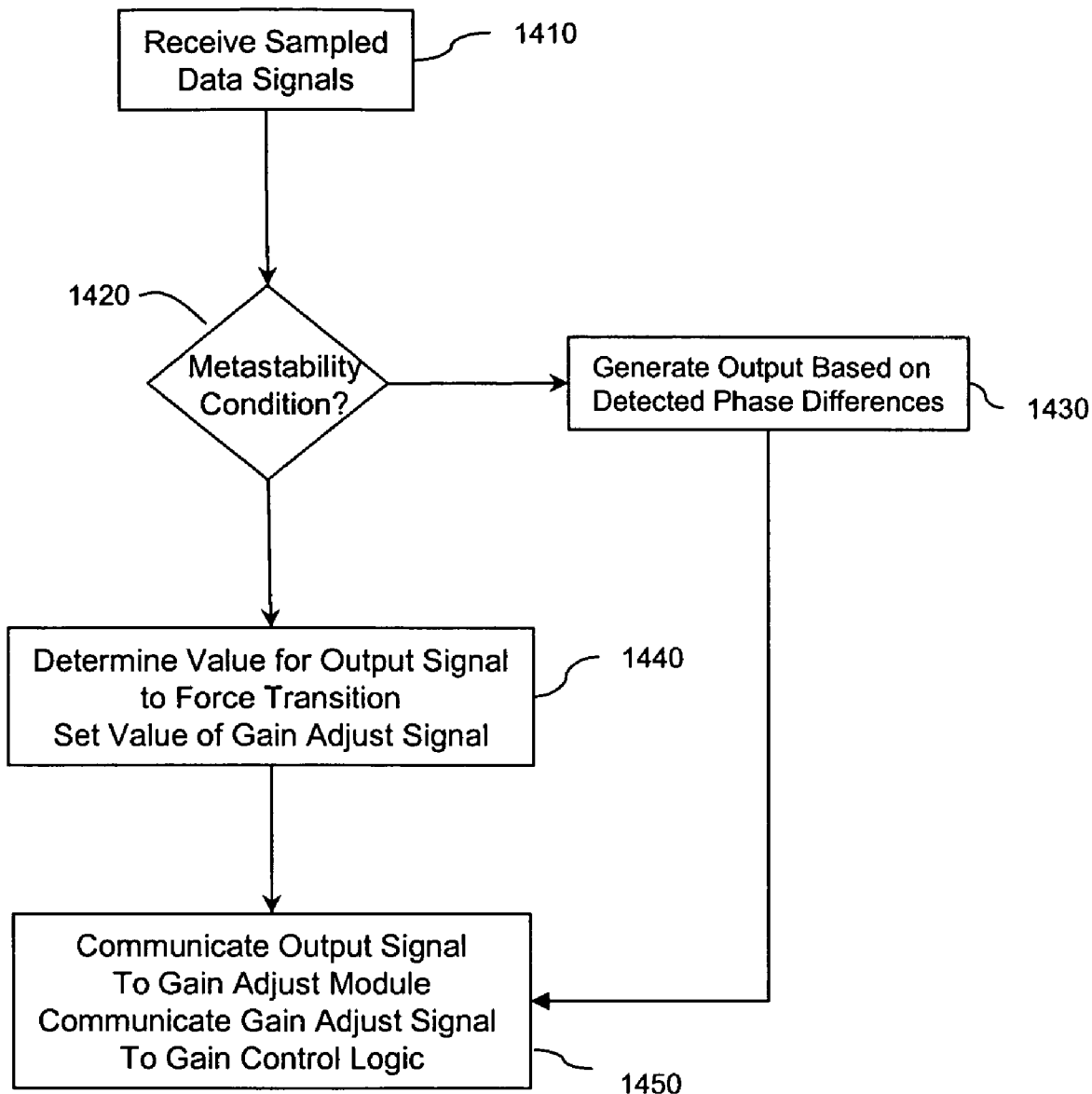

FIG. 14 is a flowchart illustrating a method for enhanced meta-stability resolution in a CDR system, according to embodiments of the present invention.

Figure 15:
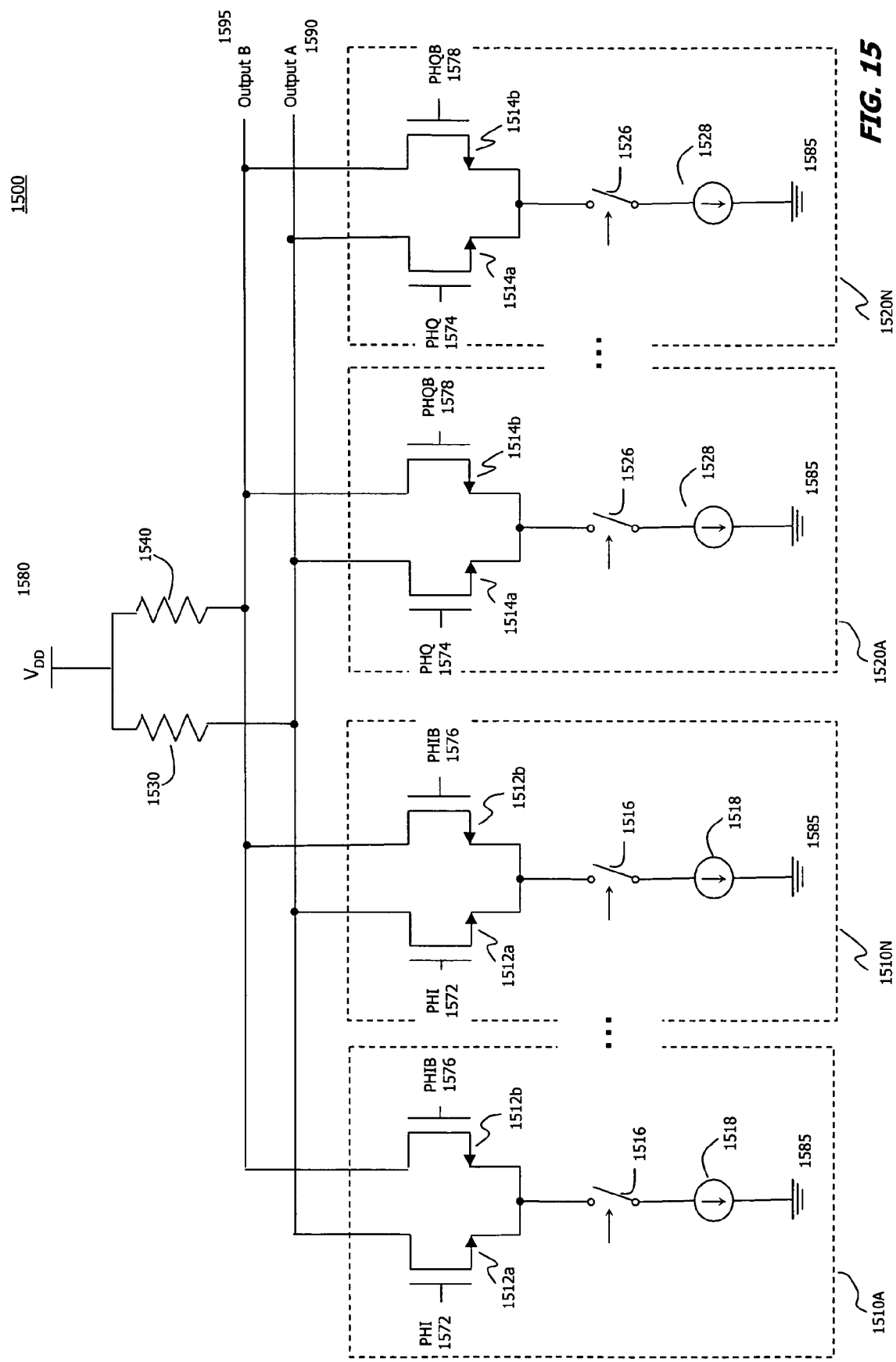

FIG. 15 depicts a phase interpolator with improved linearity, according to an embodiment of the present invention.

Figure 16:
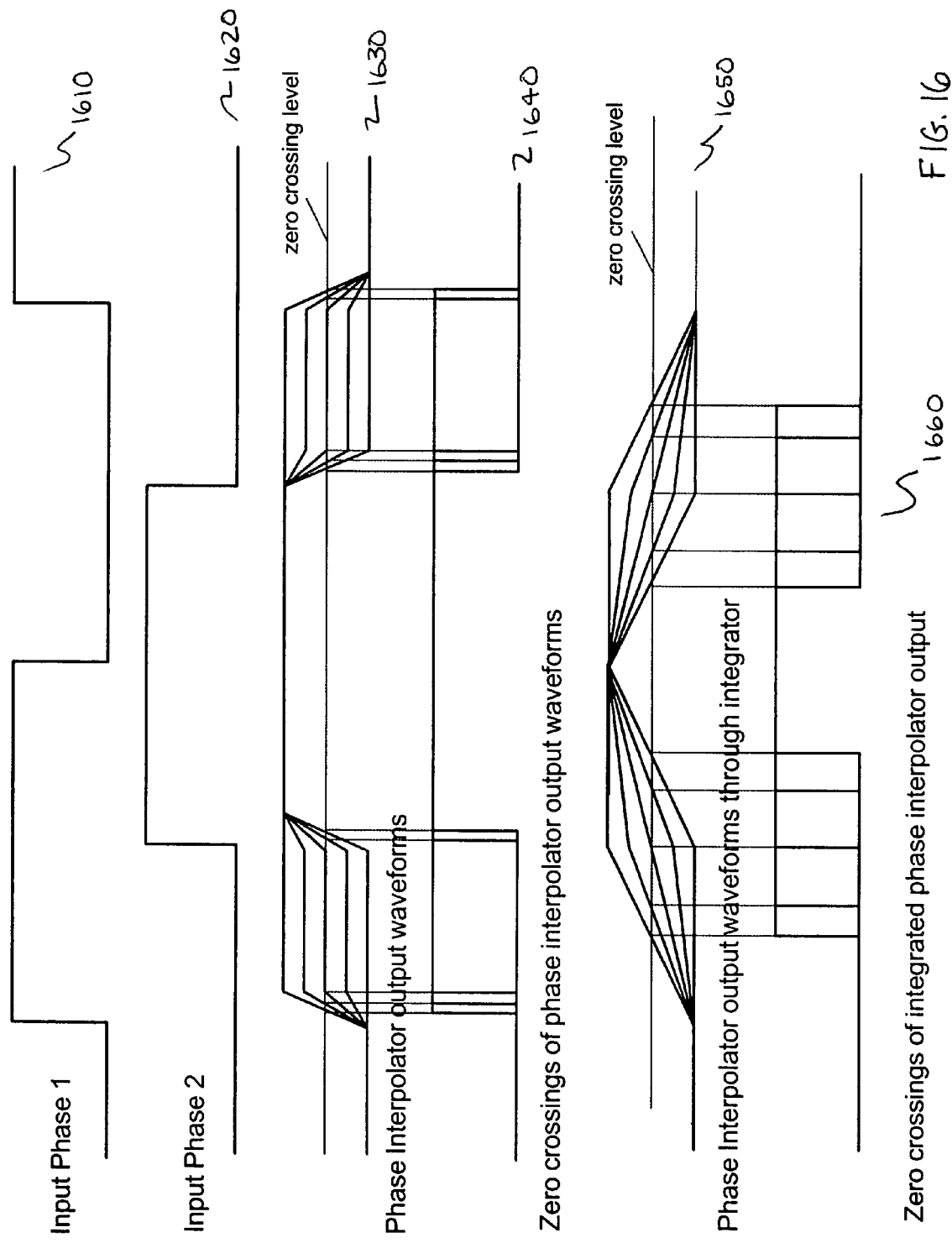

FIG. 16 illustrates exemplary waveforms generated by a phase interpolator without integration and a phase interpolator having integration.

Figure 17:
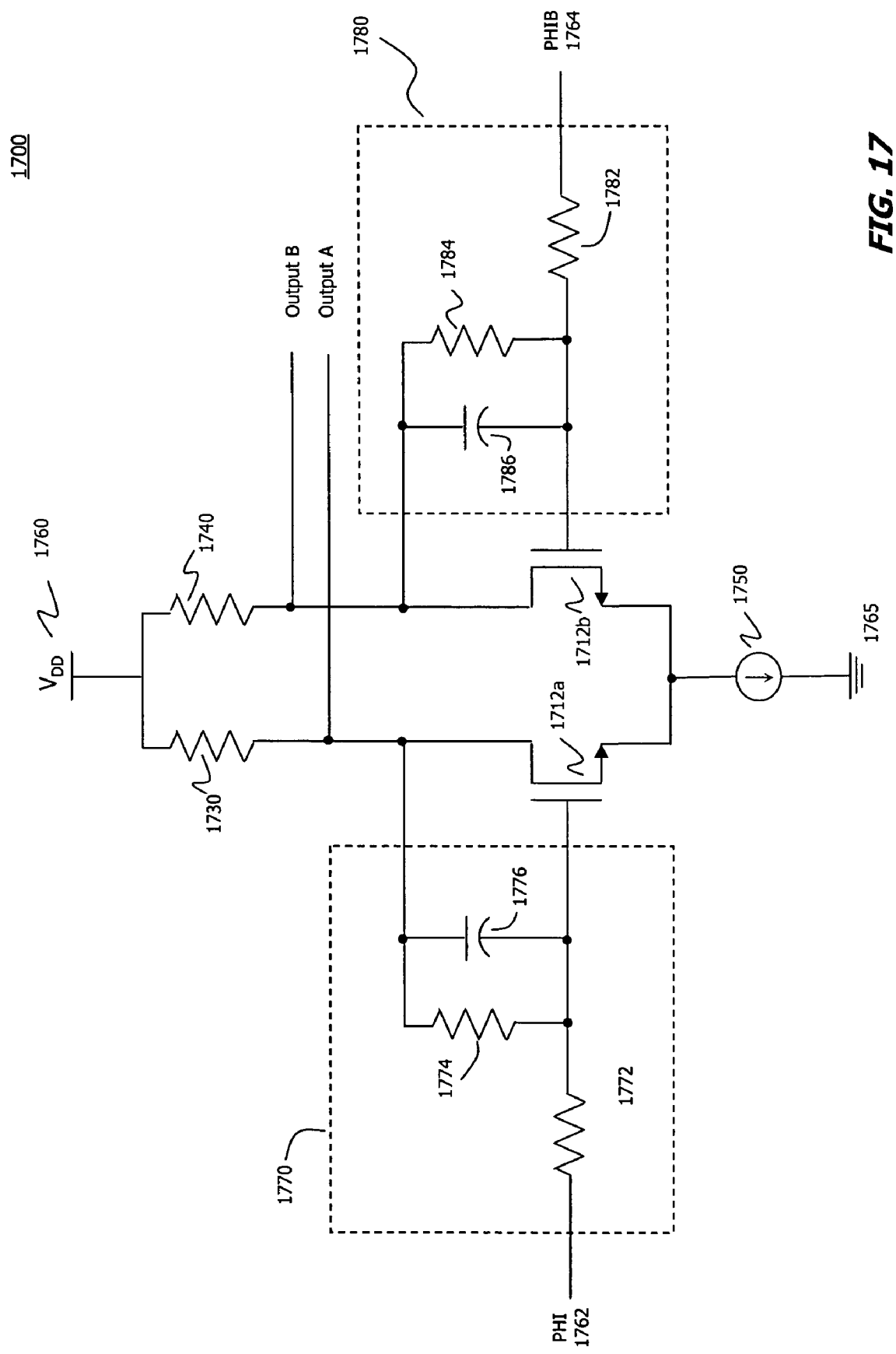

FIG. 17 depicts a phase interpolator with integrator, according to an embodiment of the present invention.

Figure 18:
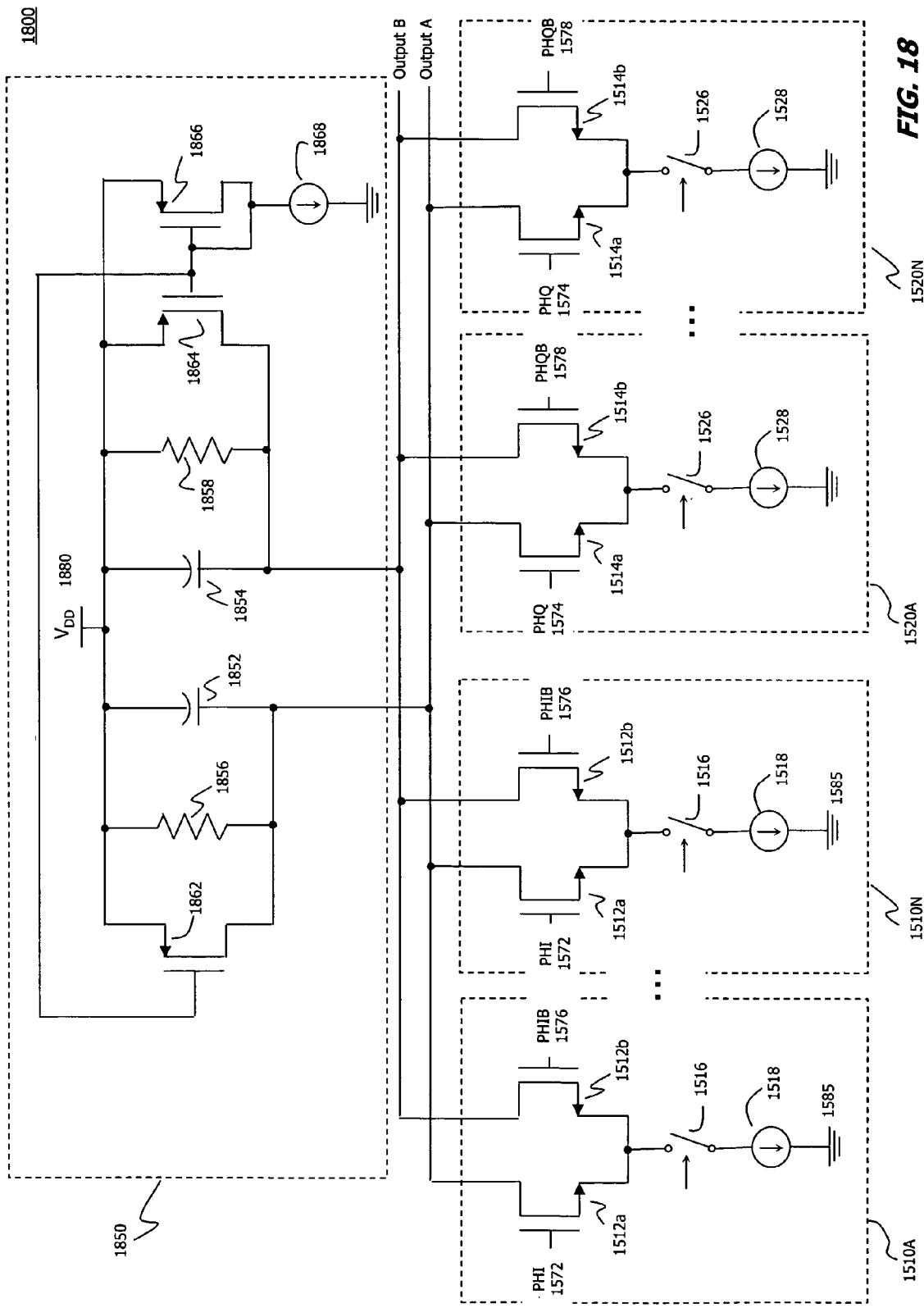

FIG. 18 depicts an exemplary phase interpolator with integrator, according to a second embodiment of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

I. High Speed, Fast Acquisition and Low Jitter Tracking CDR System

A. System Architecture

Figure 1:
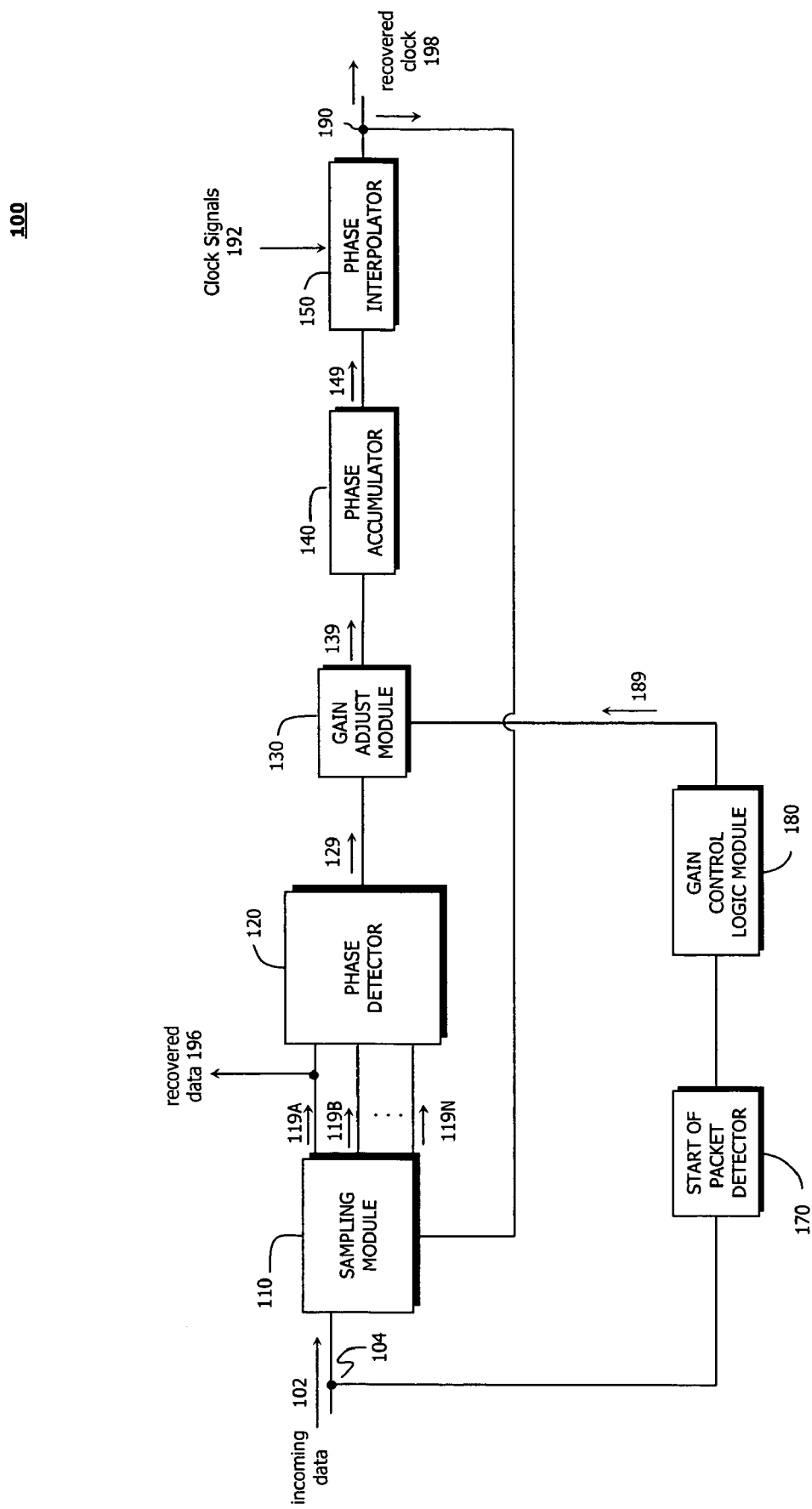
FIG. 1 is a block diagram of a high speed clock and data recovery (CDR) system using a digital delay-locked loop (DLL), according to embodiments of the present invention.

FIG. 1 is a block diagram of a high speed clock and data recovery (CDR) system 100 using a first-order digital delay-locked loop (DLL), according to embodiments of the present invention. CDR system 100 provides time varying gain adjustment, allowing high loop gain in the acquisition stage for fast phase locking and small loop gain in the tracking mode for good jitter rejection. CDR system 100 includes a sampling module 110, a phase detector 120, a gain adjust module 130, a phase accumulator 140, and a phase interpolator 150 coupled in series between CDR system input 104 and output 190. CDR system 100 also includes an optional start of packet detector 170 and an optional gain control logic module 180 coupled between CDR system input 104 and gain adjust module 130.

In system 100, sampling module 110 receives the incoming data signal 102 and the recovered clock signal 198 generated by phase interpolator 150. Sampling module 110 is configured to sample the incoming data stream 102 at one or more points in time using the recovered clock signal 198. Sampling module 110 is also configured to generate one or more output signals 119A–119N, one per sampling point, and to communicate the sampled data signal(s) to phase detector 120.

Phase detector 120 receives the sampled data signals (e.g., 119A through N) from sampling module 110. Phase detector 120 is configured to detect the phase differences between the received sampling signals 119A–N and the recovered clock signal 198. Phase detector 120 is further configured to generate an output signal 129. Output signal 129 controls the sampling speed of the DLL (e.g., causing the system to speed up sampling or to slow down sampling). In an embodiment, output signal 129 is capable of conveying sign and magnitude information. For example, output signal 129 can be a 2 bit binary number having a one bit sign component and a one bit magnitude component. Alternatively, output signal 129 can be a single bit stream representing both the sign and magnitude.

Figure 2A:
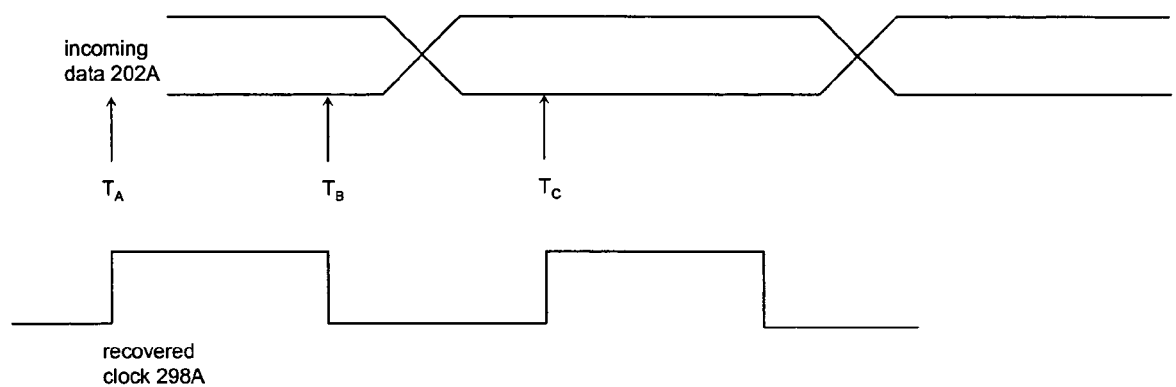
FIGS. 2A and 2B illustrate exemplary sampling points for input waveforms.
Figure 2B:
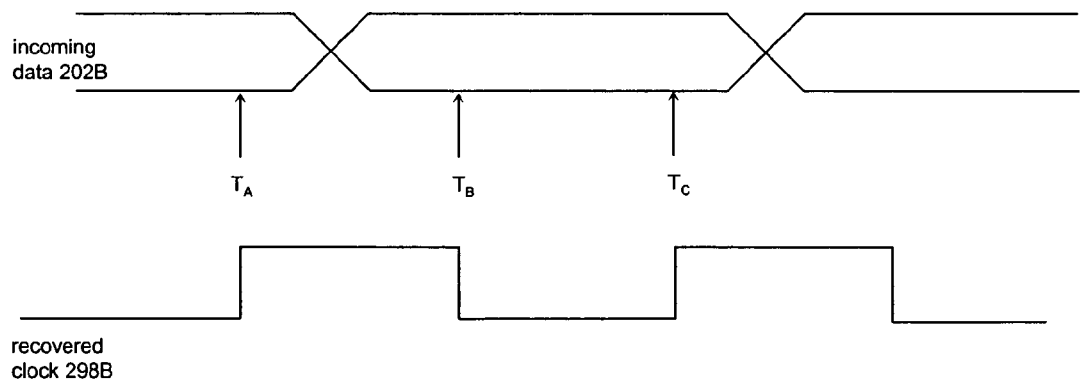

FIGS. 2A and 2B illustrate exemplary sampling scenarios that could be encountered by phase detector 120. FIG. 2A depicts the scenario where the sampling points ($T_A$, $T_B$, and $T_C$) of sampling module 110 lead the input waveform. In this scenario, each sample time precedes (i.e., leads) the optimal sample time. The optimal sampling point of a signal is usually at the center of each data bit. In the embodiment, the rising edge of recovered clock 298A is used to sample the incoming data 202A to generate the recovered data stream. As shown in FIG. 2A, the phase of sampling signal 298A leads the phase of the incoming data signal 202A. In response to receiving sampling points indicative of this leading scenario, phase detector 120 generates a control signal to retard sampling signal 298A relative to input data signal 202A. In this example, the phase detector 120 generates an output signal 129 having a sign and magnitude causing the loop to slow down sampling (e.g., output=00).

FIG. 2B depicts the situation where the sampling points of sampling module 110 lag the incoming data signal 202B. In this example, the phase detector 120 generates an output signal 129 having a sign and magnitude causing the loop to speed up sampling (e.g., output=11).

Returning to FIG. 1, CDR system 100 also includes an optional start of packet detector 170 and an optional gain control logic module 180 coupled between the input 104 and gain adjust module 130 to allow for time-varying gain adjustments. When present, start of packet detector 170 receives incoming data signal 102. Start-of-packet detector 170 is configured to detect when reception of the preamble of incoming data signal 102 has started and to communicate the detection to gain control logic module 180. Thus, at the start of preamble reception, an output from the start of packet detector 170 is available.

Although FIG. 1 depicts start of packet detector 170 and gain control logic module 180 as separate elements, persons of ordinary skill in the art will recognize that start of packet detector 170 and gain control logic module 180 can be implemented in other configurations such as in the same logic module.

Gain control logic module 180 includes logic and/or circuitry to determine the appropriate gain value to be applied by gain adjust module 130. The determination can be based on an elapsed number of clock cycles and/or information received from other elements of system 100. Gain control logic module 180 communicates the determined gain value to gain adjust module 130.

In an embodiment, gain control logic module 180 includes a data structure for storing pre-computed gain values. FIG. 3 depicts an exemplary data structure 382 including pre-computed gain values based on elapsed clock cycles. As can be seen in table 382, the gain value is halved after each clock cycle until a gain value of 1 is reached. The gain value is held at 1 for the remaining clock cycles. As would be appreciated by persons of ordinary skill in the art, other methods for computing gain values could be used to populate data structure 382.

Gain adjust module 130 is configured to adjust the overall gain of system 100 based on a gain value and signal received from phase detector 120. In an embodiment, the gain value may be received from gain control logic module 180. In an alternate embodiment, the gain value is stored or calculated locally. Gain adjust module 130 generates an output signal 139 having one or more bits (e.g., b bits) and communicates the signal to phase accumulator 140. FIG. 4 illustrates an exemplary table 432 of values for a 6-bit output signal 139 based on various gain values. In table 432, s indicates that the value of the sign component of signal 129 is used for the bit and z indicates that the value of the magnitude component of signal 129 is used for the bit.

Figure 5:
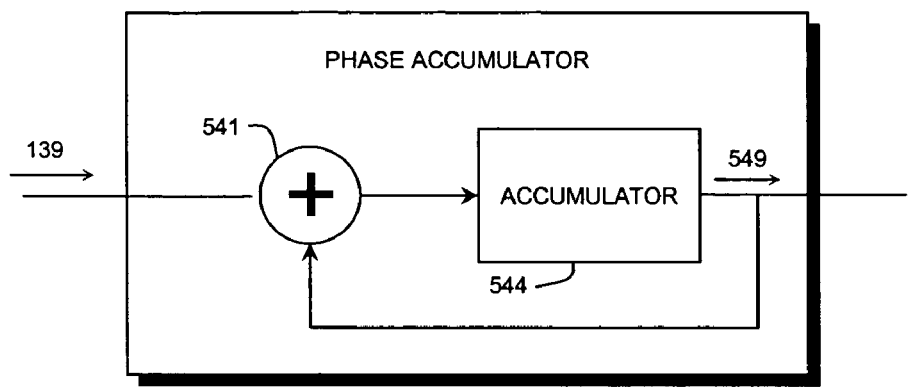
FIG. 5 depicts an exemplary phase accumulator, in accordance with embodiments of the present invention.

Phase accumulator 140 is coupled to gain adjust module 130 and phase interpolator 150. The phase accumulator 140 serves as a digital integrator. The most significant p output bits of the accumulator are communicated in signal 149 to the phase interpolator to adjust the phase of the recovered clock. FIG. 5 depicts an exemplary phase accumulator 540. Phase accumulator 540 includes an adder circuit 541 coupled to an accumulator 544. The adder circuit 541 receives the output signal 139 from gain adjust module 130 and the output signal 549 from accumulator 544. Persons of skill in the art will appreciate that other implementations for phase accumulator 140 can be used with the invention.

Phase interpolator 150 is coupled to phase accumulator 140, sampling module 110, and system output 190. Phase interpolator 150 is configured to receive clock signals 192 and the output signal 149 from phase accumulator 140. Using these inputs, phase interpolator 150 generates a signal 198 (i.e., sampling clock signal or recovered clock signal) and communicates the signal to sampling module 110.

Figure 6:
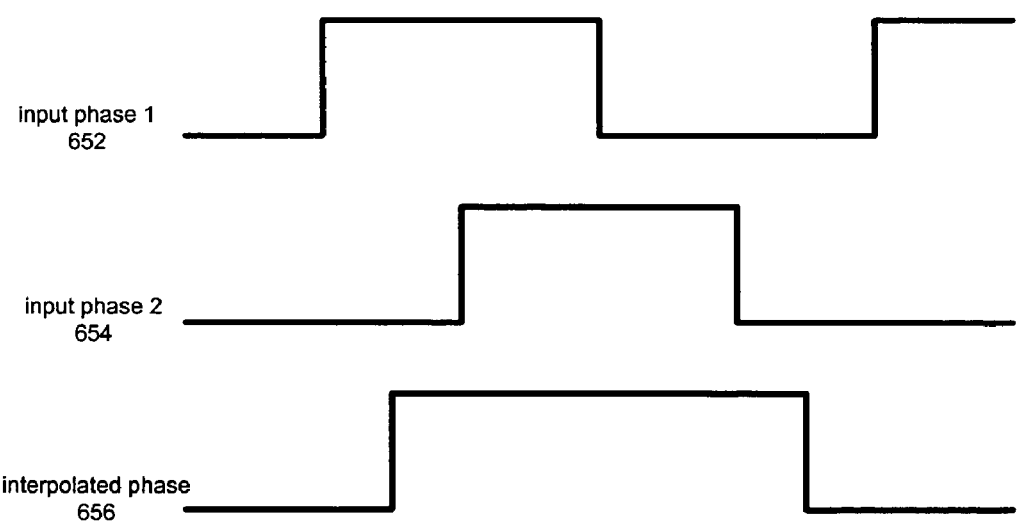
FIG. 6 shows an illustration of input signals and output signal of a phase interpolator using two input clock phases which are in phase quadrature.

In general, a phase interpolator receives clock signals which are spaced equally in phase and produces an output clock in which the phase is a linear interpolation of the input clock phases. The interpolated phase is a function of an input digital word, such as signal 149 from phase accumulator 140 which could also be a voltage or current, and the input phases of clock signals 192. FIG. 6 shows an illustration of input signals 652, 654 and output signal 656 of a phase interpolator using two input clock phases which are in phase quadrature. The phase interpolator generates an output clock signal 656 in which the phase has a certain number of discrete phase steps determined by a digital input word.

Figure 7:
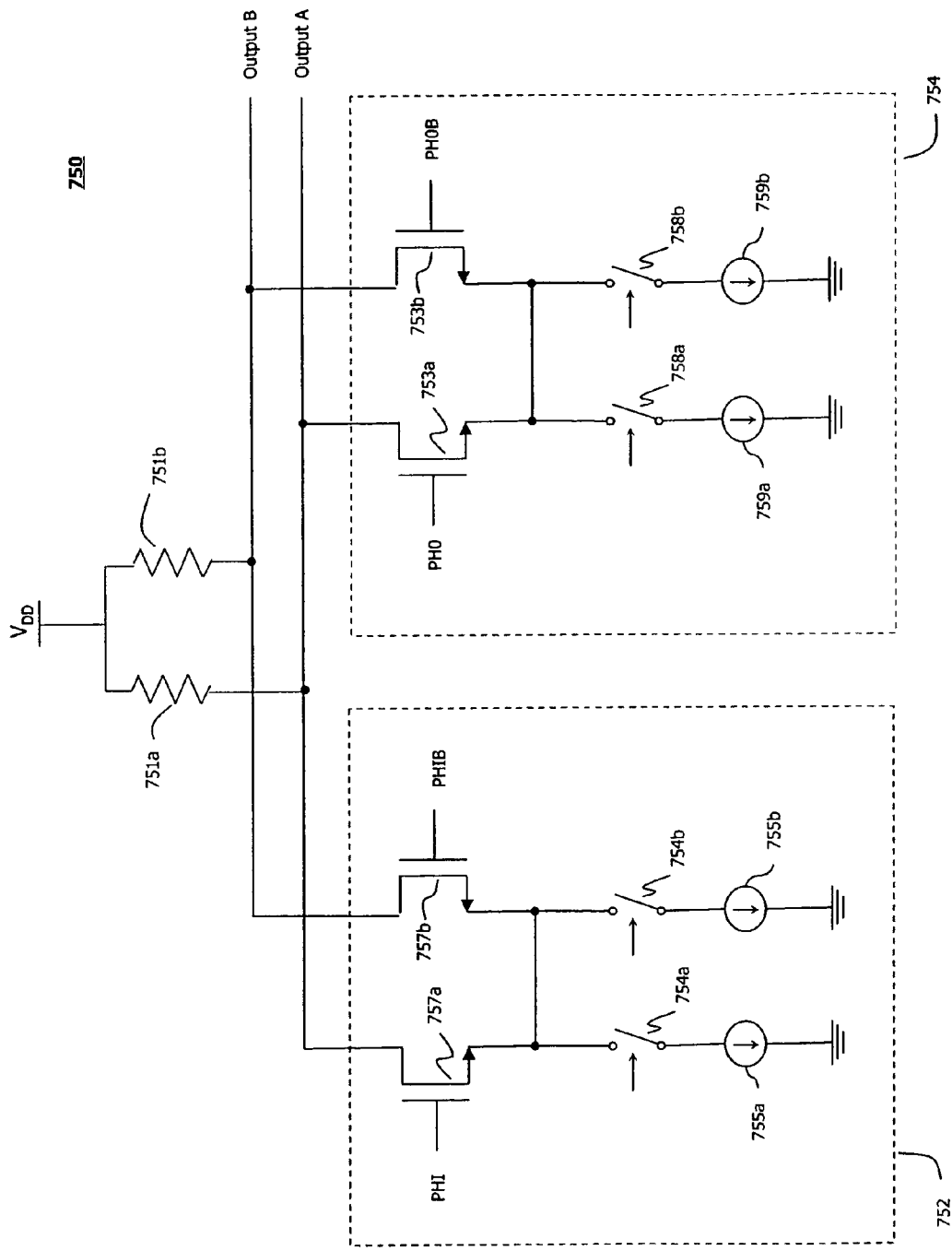
FIG. 7 depicts a phase interpolator, in accordance with embodiments of the present invention.

In an embodiment of the present invention, phase interpolator 150 is a conventional phase interpolator. FIG. 7 depicts an exemplary conventional phase interpolator 750. Phase interpolator 750 includes two differential circuits 752 and 754, each receiving two clock signals which are in phase quadrature. Current sources 755a and 755b are coupled to differential circuit 752. Current sources 759a and 759b are coupled to differential circuit 754. The current sources are used to set the desired ratio of current for each circuit. For example, differential circuit pair I 752 receives a portion of the total current and differential circuit pair Q 754 receives the remainder of the total current. The ratio of current can be controlled by setting the position of switches 754a, 754b, 758a, and 758b (e.g., via a control signal). The current ratio is used to set the output clock phase with respect to the input clock signals.

For example, if differential circuit pair I 752 receives the full amount of current (e.g., switches 754a and 754b are closed) and differential circuit pair Q 754 has no current (e.g., switches 758a and 758b are open), then the output phase will align with the input clock phase I. If both differential circuit pairs receive the same amount of current (i.e., half of total), then the output clock phase will be in the middle between the two clock phases.

1. Sampling Module

Figure 8A:
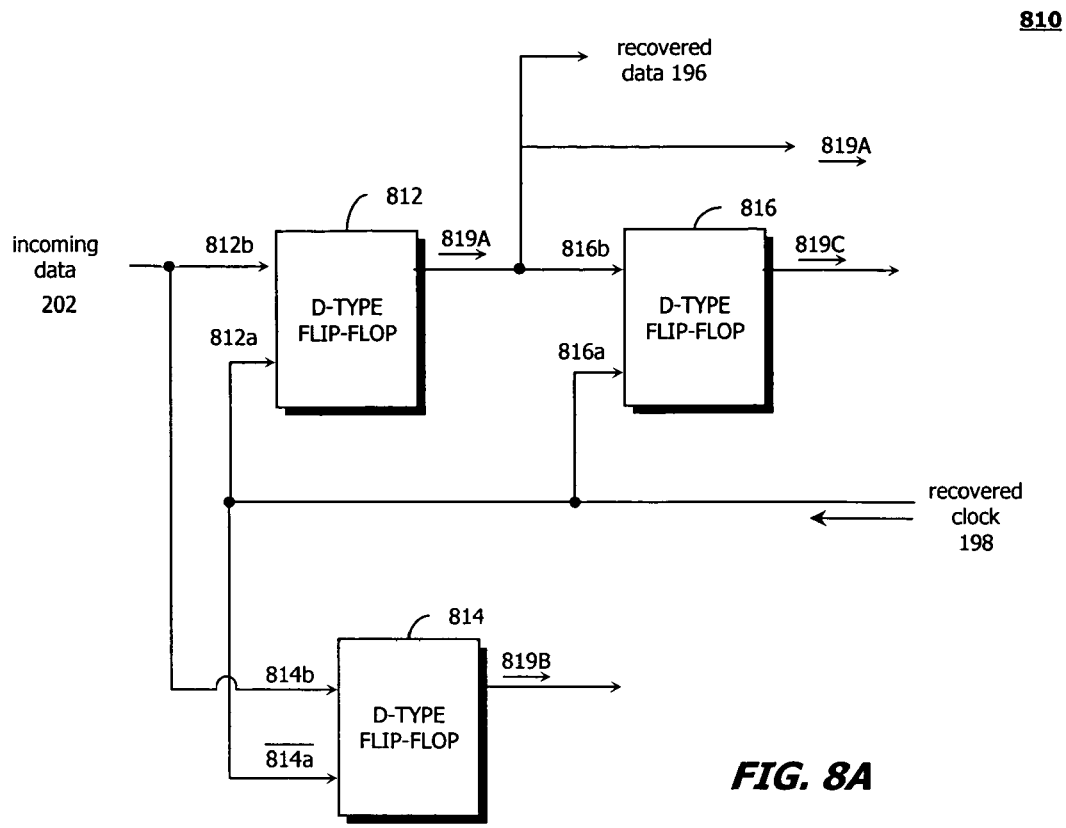
FIG. 8A is a block diagram of an exemplary sampling module, according to an embodiment of the present invention.

FIG. 8A is a block diagram of an exemplary sampling module 810, according to an embodiment of the present invention. Sampling module 810 includes three D-type flip-flops (DFFs) 812, 814, 816. DFF 812 and DFF 816 receive the recovered clock signal 198 generated by phase interpolator 150. at clock input 812a and 816a, respectively. DFF 814 receives the inverse of the recovered clock signal 198 at its clock input 814a. DFF 812 and DFF 814 also receive the incoming data signal 102 at their second inputs 812b and 814b. DFF 816 receives the output of DFF 812 at its second input 816b.

Figure 8B:
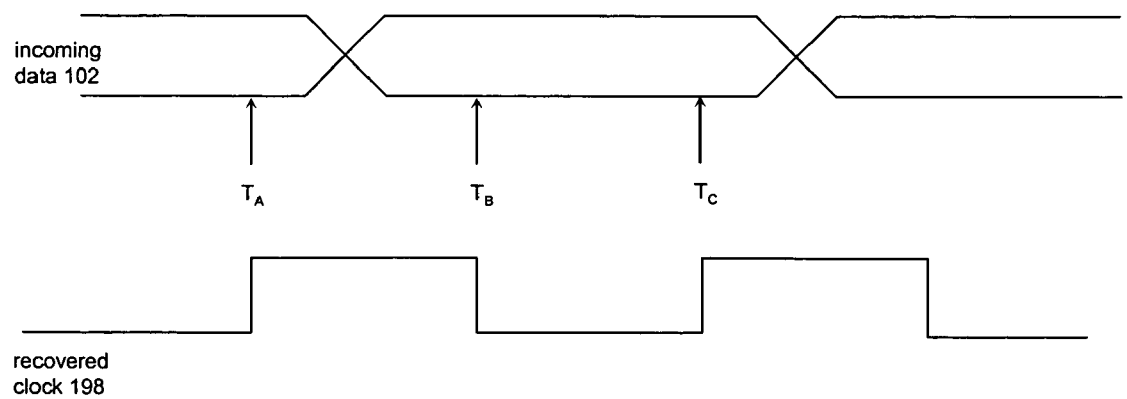
FIG. 8B is a block diagram of sampling intervals, according to an embodiment of the present invention.

The DFFs sample incoming data signal 802 at three points, $T_A$, $T_B$, and $T_C$, as shown in FIG. 8B. The output signal 819A of DFF 812 is applied to a first input of phase detector 120 and the second input of DFF 816, the output signal 819B of DFF 814 is applied to a second input of phase detector 120, and the output signal 819C of DFF 816 is applied to a third input of phase detector 120. While FIG. 8A depicts sampling module 110 as including three D-type flip-flops, persons skilled in the relevant arts will recognize that other implementations for sampling module 110 can be used with the present invention.

2. Phase Detector with Metastability Resolution

In an embodiment of the present invention, phase detector 120 is a conventional phase detector including phase detection logic and/or circuitry. However, as described above, conventional phase detectors have limited ability to detect and react to dead state or meta-stability conditions. FIG. 9A–9C illustrate three exemplary cases of meta-stability conditions. FIG. 9A depicts a meta-stability condition where the sampling points are oppositely aligned with the input waveform 902. In FIG. 9B and 9C, the input waveform 902 has a non fifty percent duty cycle. In these cases, the probability of meta-stability occurrence is high. Under a meta-stability condition, the output signal does not cause the DLL to speed up or slow down sampling. This inaction by the phase detector causes the loop to remain in the meta-stable state. As a result, the DLL cannot adjust the recovered clock to achieve optimal sampling of the incoming data signal.

In typical applications, a frequency drift exists between the frequency of the receiver CDR clock source and the frequency of the incoming data signal. Therefore, in applications having long synchronization pulses preceding the data, meta-stability is not an issue because the DLL has sufficient time for the frequency drift to cause a transition from the meta-stable state. However, in applications where the preamble (or synchronization pulses) is short, the DLL cannot rely on frequency drift to resolve the meta-stability condition. In these applications, a more rapid resolution to the meta-stability condition is required.

In an embodiment of the present invention, phase detector 120 includes meta-stability resolution logic. FIG. 10A depicts a phase detector 1020 having meta-stability resolution. Phase detector 1020 includes phase detection logic 1022 and meta-stability resolution logic 1024. Meta-stability resolution logic 1024 is configured to determine when a meta-stability condition occurs and to generate an output signal 1029 to mitigate the condition. When no meta-stability condition is detected, output signal 1029 adjusts the sampling of the DLL based on detected phase differences. When a meta-stability condition is detected, the output signal 1029 forces the DLL in a specific direction to cause the DLL to transition from the meta-stable state in the shortest possible time.

In an embodiment of the present invention, phase detector 1020 includes an optional data structure 1026. The meta-stability resolution logic 1024 is configured to access the data structure to determine if a meta-stability condition is occurring and to determine the appropriate output signal based on the received input signals. In an embodiment, a meta-stability condition is identified based on the values of the input signals received by the phase detector. However, other methods can be used to identify meta-stability conditions.

FIG. 10B depicts an exemplary data structure 1026B, in accordance with embodiments of the present invention. In the exemplary data structure 1026B depicted in FIG. 10B, optional data structure 1026 includes entries 1021a–1021h representing combinations of input signals 1019A through 1019N. Each entry 1021a–1021h includes an output signal field having a sign component field 1023 and a magnitude component field 1025. While FIG. 10B depicts the sign and magnitude components as having pre-defined one bit values, a person of ordinary skill in the art will recognize that other formats and values for the sign and magnitude components can be used with the invention.

For example, in FIG. 10B, entry 1021c and 1021f represent the meta-stability conditions (sampled input signal values equal to 0 1 0 and 1 0 1) depicted in FIGS. 9B and 9C, respectively. A binary phase detector without meta-stability detection and resolution logic would generate an output signal having a sign component equal to 0 and a magnitude component equal to 0, for each case. As a result, the DLL would take no action to adjust the phase of the recovered clock signal. However, as depicted in FIG. 10B, the phase detector having meta-stability resolution logic generates a sign component having a value equal to 1 and a magnitude equal to 1, for each case. Thus, the phase detector forces the DLL to transition from the meta-stable state.

B. Methods

1. Method for Time Varying Gain Adjustment

FIG. 11 is a flowchart illustrating a method 1100 for time varying gain adjustment in a CDR system. Method 1100 is described in reference to the exemplary CDR system 100 depicted in FIG. 1. However, method 1100 is not limited to that embodiment. Note that some steps in method 1100 do not necessarily have to be performed in the order shown.

Method 1100 begins a step 1110 when the start of preamble is detected. In an embodiment, the start of preamble is detected by the start of packet detector 170.

In step 1120, the gain value for the loop is set to an initial value. In an embodiment, the initial value is the maximum gain acceptable for the CDR system. As would be appreciated by persons of skill in the art, other initial values can be used.

In step 1130, the system gain value determined in step 1120 or step 1160 is applied to the phase adjustment signal generated by the phase detector for one or more cycles.

In step 1140, a determination is made whether the value of the system gain equals a final gain value for the system. The final gain value is a minimum (or final) gain to be applied for the remaining cycles. If the system gain equals the final gain, operation proceeds to step 1150. If the system gain does not equal the final gain, operation proceeds to step 1160.

In step 1150, the final gain value is applied to the phase adjustment signal generated by the phase detector for the remaining cycles.

In step 1160, the value of the system gain is reduced. In an embodiment, the reduced gain value is determined by accessing a data structure storing pre-computed gain values. For example, the exemplary data structure 382 depicted in FIG. 3 could be accessed. In another embodiment, the gain value may be calculated in real time. As would be appreciated by persons skilled in the art, other methods for determining gain value using available information could be used with the present invention. Operation then returns to step 1130.

Steps 1130, 1140, and 1160 are repeated until the system gain equals the final gain.

Incorporating the above time-varying gain adjustment in CDR system 100 enables fast acquisition during the synchronization phase and low jitter performance during the actual data reception phase. For example, at the start of data packet transmission, a sequence of synchronization pulses is available.

By applying the maximum gain value, the loop aligns to the incoming data packet transitions in the fastest possible time. As time progresses during the synchronization period, the gain is gradually decreased. Therefore, by the time the actual data payload is received, the loop gain is decreased to a sufficiently small value and the recovered clock is aligned to the incoming data signal. The alignment represents the optimal sampling point for minimum bit errors.

2. Method for Meta-Stability Resolution

FIG. 12 is a flowchart illustrating a method 1200 for meta-stability resolution in a CDR system, according to an embodiment of the present invention. Method 1200 is described in reference to the exemplary phase detector 1020 depicted in FIG. 10A and exemplary CDR system 100 depicted in FIG. 1. However, method 1200 is not limited to those embodiments. Note that some steps in method 1200 do not necessarily have to be performed in the order shown.

Method 1200 begins at step 1210 when the phase detector 120 receives sampled data signals from sampling module 110.

In step 1220, a determination of whether a meta-stability condition is occurring in the CDR system is made. In an embodiment, a meta-stability condition is detected by accessing data associated with the values of the received sampled data signals. For example, the data may be stored in a data structure, such as described above in reference to FIG. 10B. If a meta-stability condition is detected, operation proceeds to step 1240. If no meta-stability condition is detected, operation proceeds to step 1230.

In step 1230, the phase detector generates a signal based on detected phase differences and communicates the signal to gain adjust module 130. Operation then proceeds to step 1250.

In step 1240, the phase detector determines the value for an output signal to force the CDR to transition from the meta-stability condition in the shortest possible time and generates a modified output signal. In an embodiment, the value for the output is determined by accessing data associated with the values of the received sampled data signals. For example, the data may be stored in a data structure, such as described above in reference to FIG. 10B.

In step 1250, the phase detector communicates the modified output signal to gain adjust module 130.

II. Fast Acquisition & Low Jitter Tracking CDR System Having Enhanced Meta-Stability Resolution FIG. 13A depicts a system 1300 having enhanced meta-stability resolution, in accordance with embodiments of the present invention. System 1300 includes a phase detector 1320 coupled to sampling module 1310, gain adjust module 1330, and gain control logic 1380. The sampling module 1310, gain adjust module 1330, and gain control logic 1380 are described above in reference to FIG. 1. Phase detector 1320 includes phase detection logic 1322, enhanced meta-stability logic 1324, and an optional data structure 1326.

Meta-stability resolution logic 1324 is configured to determine when a meta-stability condition occurs and to generate two output signals 1327 and 1329. Output signal 1329 is communicated to the gain adjust module 1330. Output signal 1329 adjusts the sampling phase output of system 1300 based on detected phase differences. When a meta stability condition occurs, output signal 1329 forces sampling in a specific direction.

Output signal 1327 is communicated to gain control logic 1380. Output signal 1327 is configured to reset the gain of system 1300 to a recovery value when a meta stability condition is detected. In an embodiment, the recovery value is the maximum gain acceptable for the CDR system. By setting the value to the maximum gain, system 1300 can take the maximum phase step possible during transition from the meta-stable state. In an embodiment of the present invention, output signal 1327 is only sent when a meta-stability condition is encountered. In an alternate embodiment, output signal 1327 is always sent. When no meta-stability condition is encountered, output signal 1327 has a value indicating that no action should be taken by gain control logic module 1380.

In an embodiment of the present invention, phase detector 1320 also includes an optional data structure 1326. The meta-stability resolution logic 1324 accesses the data structure to determine if a meta-stability condition is occurring and to determine the appropriate output signals 1327 and 1329 to generate based on the received input signals. FIG. 13B depicts an exemplary data structure 1326B, in accordance with embodiments of the present invention. In the exemplary data structure 1326B depicted in FIG. 13B, optional data structure 1326 includes entries for all possible combinations of input signals 1319A through 1319N. Each entry 1321a–1321h includes an optional signal field having a sign component field 1323 and a magnitude component field 1325 to use for output signal 1329 and a value number to use for output signal 1327. While FIG. 13B depicts the sign and magnitude components and the value of output signal 1327 as having pre-defined one bit values, a person of ordinary skill in the art will recognize that other formats and values for the sign and magnitude components can be used with the present invention.

For example, in FIG. 13B, entry 1321c and 1321f represent meta-stability conditions (sampled input signal values equal to 0 1 0 and 1 0 1) depicted in FIGS. 9B and 9C, respectively. As depicted in FIG. 13B, the phase detector having enhanced meta-stability resolution logic generates a sign component having a value equal to 1 and a magnitude equal to 1 and a output signal 1327 having a value equal to 1, for each case. Thus, phase detector 1320 instructs gain control logic module 1380 to reset the gain of system 1300 to its maximum value.

FIG. 14 is a flowchart illustrating a method 1400 for enhanced meta-stability resolution in a CDR system, according to an embodiment of the present invention. Method 1400 is described in reference to the exemplary CDR system 1300 depicted in FIG. 13. However, method 1400 is not limited to those embodiments. Note that some steps in method 1400 do not necessarily have to be performed in the order shown.

Method 1400 begins at step 1410 when the phase detector 1320 receives sampled data signals from sampling module 110.

In step 1420, a determination of whether a meta-stability condition is occurring in the CDR system is made. In an embodiment, a meta-stability condition is detected by accessing data associated with the values of the received sampled data signals. For example, the data may be stored in a data structure, such as described above in reference to FIG. 13B. If a meta-stability condition is detected, operation proceeds to step 1440. If no meta-stability condition is detected, operation proceeds to step 1430.

In step 1430, the phase detector generates a signal based on detected phase differences and communicates the signal to gain adjust module 1330.

In step 1440, the phase detector determines the value for an output signal to force the CDR to transition from the meta-stability condition in the shortest possible time and generates a modified output signal. In this step, the phase detector also sets the value of gain adjust signal 1327. Gain adjust signal 1327 is configured to reset the gain of the system to achieve the desired transition time. For example, the gain adjust signal 1327 may indicate that the system gain should be reset to the maximum acceptable value to allow the maximum phase steps to be taken during transition from the meta-stability state.

In step 1450, the phase detector communicates the modified output signal to gain adjust module 1330 and the gain adjust signal 1327 to gain control logic 1380. In an embodiment, gain adjust signal 1327 is only communicated when a meta-stability condition is detected. In an alternate embodiment, gain adjust signal 1327 is always sent.

II. Phase Interpolator Having Increased Linearity

Conventional phase interpolators, such as depicted in FIG. 7, have several limitations. For example, the gate to source voltages of input transistors 757a, 757b, 753a, and 753b are affected by the amount of current flowing through the transistors. The amount of current, in turn, depends on whether switches 754a, 754b, 758a, and 758b are opened or closed. Because the supply of current is determined by the amount of phase to be interpolated and characteristics of the transistors, the resultant phase is not linearly interpolated.

Furthermore, a conventional phase interpolator typically includes two differential amplifiers, each amplifier having a differential transistor pair. Because currents in an adjacent differential transistor pair start to switch in or out every quarter of a clock cycle, the phase interpolator generates output signals having vastly different slopes across low-to-high or high-to-low transitions. This results in the phase being interpolated in unequal steps.

One current technique used to improve the phase step linearity of a phase interpolator is to use a higher number of clock sources with smaller phase offsets as input to the interpolator. This technique is problematic as the number of clock signals with fixed phase offsets is difficult to generate and often just depends upon how many voltage controlled oscillator stages are used.

Another technique is to reduce the slope of the input clock sources before inputting the sources into the phase interpolator. This produces more time overlap between adjacent clock input transitions and produces more linear phase steps at the output. The disadvantage of this technique is that the reduced slope makes the time at which an input differential pair turns on more sensitive to device random offsets. For example, the random delay of differential pair stages due to device offsets is inversely proportional to the voltage slope of the input signal. This change in delay with respect to other differential pairs causes interpolated phase errors and degrades the phase linearity.

A. Phase Interpolator with Improved Linearity Architecture

FIG. 15 depicts a phase interpolator 1500 with improved linearity, according to an embodiment of the present invention. Phase interpolator 1500 can be used as phase interpolator 150 in CDR system 100. Although phase interpolator 1500 is described in the context of a CDR system, phase interpolator 1500 can also be used in a wide range of other applications including frequency synthesis circuits such as integer-N PLL and fractional-N PLL circuits, and IQ modulators/demodulators for carrier-based and wireless communications.

Phase interpolator 1500 has a plurality of first branches 1510A through 1510N, a plurality of second branches 1520A through 1520N, a first resistance 1530, and a second resistance 1540. Each first branch 1510A–N includes a differential transistor pair 1512, a switch 1516, and a current source 1518. Differential transistor pair 1512 includes a first transistor 1512a and a second transistor 1512b. The gate of first transistor 1512a is coupled to input-PHI 1572 to receive one component of the differential input signal. The drain of first transistor 1512a is coupled to output A 1590 and resistance 1530. The gate of second transistor 1512b is coupled to input-PHIB 1576 to receive a second component of the differential input signal. The drain of second transistor 1512b is coupled to output B 1595 and resistance 1540. The source of first transistor 1512a and the source of second transistor 1512b are coupled to switch 1516. Current source 1518 is coupled between switch 1516 and ground 1585.

Each second branch 1520 A–N includes a differential transistor pair 1522, a switch 1526, and a current source 1528. Differential transistor pair 1522 includes a first transistor 1522a and a second transistor 1522b. The gate of first transistor 1522a is coupled to input-PHQ 1574 to receive one component of the differential input signal. The drain of first transistor 1522a is coupled to output A 1590 and resistance 1530. The gate of second transistor 1522b is coupled to input-PHQB 1578 to receive a second component of the differential input signal. The drain of second transistor 1522b is coupled to output B 1595 and resistance 1540. The source of first transistor 1522a and the source of second transistor 1522b are coupled to switch 1526. Current source 1528 is coupled between switch 1516 and ground 1585.

In an embodiment, transistors 1512a, 1512b, 1514a, and 1514b are NMOS transistors.

Resistance 1530 is coupled between supply voltage 1580 (VDD) and the drain of the first transistor 1512a in each first branch 1510A–N, the drain of the first transistor 1514a in each branch 1520A–N, and output A 1590. Resistance 1540 is coupled between the drain of the second transistor 1512b in each first branch 1510A–N, the drain of the second transistor 1514b in each second branch 1520A–N, and output B 1595.

Each branch 1510A–N and 1520A–N has an identical current source 1518, 1528 and switch 1516, 1526. When the switch in each branch is ON (i.e., closed), the voltage characteristics of the input transistors are nearly identical because the same current flows through the transistors. Each turned ON differential pair will contribute an approximately identical step change to the resultant phase since each contributes a unit current.

B. Phase Interpolator with Integrator

Non-ideality due to varying waveform shapes can also be reduced by incorporating an ideal integrator following the output of the phase interpolator. FIG. 16 illustrates exemplary waveforms generated by a phase interpolator without integration and a phase interpolator having integration. The first 2 waveforms in FIG. 16, input phase 1 waveform 1610 and input phase 2 waveform 1620 are passed through a 5 step interpolator. Waveform 1630 depicts the 5 interpolated waveforms at the output of the interpolator. Waveform 1640 shows the zero crossing of waveform 1630. As seen in waveform 1640, the zero crossings are highly compressed for the first 3 interpolated outputs and a large phase step appears before the next zero crossing. Waveform 1650 illustrates the output of an integrated interpolator. As illustrated in waveform 1660, the zero crossing are more equally spaced. In fact, for the third interpolator output, the phase is half of that of the first and last interpolation setting.

FIG. 17 depicts a voltage integrator 1700, according to an embodiment of the present invention. Voltage integrator 1700 can also be used in a wide range of other applications. In an embodiment, the voltage integrator is coupled to an interpolator output.

Voltage integrator 1700 includes a differential transistor pair 1712 having a first transistor 1712a and a second transistor 1712b, a first capacitive and resistive feedback portion 1770, and a second capacitive and resistive feedback portion 1780.

The first capacitive and resistive feedback portion 1770 includes a capacitor 1776 coupled between the source and gate of first transistor 1712a, a resistance 1774 coupled between the source and gate of first transistor 1712a, and a resistance 1772 coupled between input-phi 1762 and the gate of first transistor 1712a.

The second capacitive and resistive feedback portion 1780 includes a capacitor 1786 coupled between the source and gate of second transistor 1712b, a resistance 1784 coupled between the source and gate of second transistor 1712b, and a resistance 1782 coupled between input-phiB 1764 and the gate of second transistor 1712b.

Voltage integrator 1700 includes a resistance 1730 coupled between supply voltage 1760 and the drain of first transistor 1712a and a resistance 1740 coupled between supply voltage 1760 and the drain of the second transistor 1712b. Output A is coupled to the drain of the first transistor 1712a and Output B is coupled to the drain of first transistor 1712b. A current source 1750 is coupled to the drain of first transistor 1712a, the drain of second transistor 1712b, and ground 1765.

Voltage integrator 1700 is essentially an inverting amplifier with capacitive and resistive feedback. The feedback creates fairly low impedance or a weak virtual ground at the gates of transistors 1712a and 1712b at high frequencies. Resistance 1772 in the first capacitive and resistive feedback portion and resistance 1782 in the second capacitive and resistive feedback portion in conjunction with the weak virtual ground coverts the input voltages PHI 1762 and PHIB 1764 into current and integrates the current into capacitors 1776 and 1786.

FIG. 18 depicts an exemplary phase interpolator 1800 with integrator, according to a second embodiment of the present invention. Phase interpolator 1800 includes a plurality of first branches 1510A–N and a plurality of second branches 1520A–N. First and second branches 1510 and 1520 are described above in reference to FIG. 15.

Phase interpolator 1800 further includes an integrator portion 1850.

Integrator portion 1850 includes a capacitor 1852, a resistance 1856, and a transistor 1862 coupled in parallel between a supply voltage 1880 and the drains of the first transistors 1512a, 1512b in each branch 1510A–N and 1520A–N. Integrator portion 1850 further includes a capacitor 1854, a resistance 1858, and a transistor 1864 coupled between a supply voltage 1880 and the drains of the second transistors 1514a, 1514b in each branch 1510A–N and 1520A–N. The gate of transistor 1862 is coupled to the gate of transistor 1864.

Capacitors 1852 and 1854 are integrating capacitors. In an embodiment, resistances 1856 and 1858 are high value resistors and are configured to set the common mode voltage. In an embodiment, transistors 1862 and 1864 are used as a current source load.

Integrator portion 1850 further includes a diode-connected transistor 1866 and a current source 1868 coupled in series between the drain of transistor 1866 and ground 1885. The gate of transistor 1866 is coupled to the gate of transistor 1862, the gate of transistor 1864, and the current source. The source of transistor 1866 is coupled to supply voltage 1880 and the drain is coupled to current source 1868.

Because in phase interpolator 1800 the currents from the differential pairs are directly integrated by the integrator portion 1850, a separate integrator coupled to the interpolator is not required.

In an embodiment, the current sources 1518 and 1528 used in phase interpolator 1800 can be weighted as a function of the phase of the input clock source and the number of interpolator settings. The current weighted interpolator output is then integrated to further improve the linearity of the phase step output.

3. Conclusion

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A clock and data recovery system comprising:
a start of packet detector for detecting the start of a preamble of an incoming data stream;
a gain control logic module coupled to the start of packet detector, wherein the gain control logic module is configured to determine a gain value;
a phase interpolator for generating a recovered clock signal;
a sampling module coupled to the phase interpolator, the sampling module including logic for sampling a data stream using the recovered clock signal;
a phase detector coupled to the sampling module, wherein the phase detector generates a phase adjustment signal;
a gain adjust module coupled to the phase detector, the gain control logic module, and a phase accumulator, wherein the gain adjust module applies the gain value received from the gain control logic module to the phase adjustment signal; and
the phase accumulator coupled to the gain adjust module and the phase interpolator.

2. The clock and data recovery system of claim 1, wherein the gain value is determined based on an elapsed number of clock cycles.

3. The clock and data recovery system of claim 1, wherein the gain control logic module includes a data structure including gain values.

4. The clock and data recovery system of claim 1, wherein the phase detector comprises:
phase detection logic; and
meta-stability resolution logic for mitigating meta-stability conditions.

5. The clock and data recovery system of claim 4, wherein the phase detector further comprises:

a data structure including values for the phase adjustment signal based on values of received sampled signals.

6. The clock and data recovery system of claim 5, wherein the phase adjustment signal values are configured to mitigate a meta-stability condition.

7. The clock and data recovery system of claim 4, wherein the phase detector is coupled to the gain control logic module.

8. The clock and data recovery system of claim 7, wherein the phase detector is further configured to generate a gain control signal and communicate the gain control signal to the gain control logic module.

9. The clock and data recovery system of claim 8, wherein the phase detector is configured to generate the gain control signal when a meta-stability condition is identified.

10. The clock and data recovery system of claim 1, wherein the phase interpolator comprises:
   a plurality of first branches, wherein each of the first branches includes:
      a first transistor receiving a first signal at its gate, wherein a drain of the first transistor is coupled to a first output,
      a second transistor receiving a second signal at its gate, wherein a drain of the second transistor is coupled to a second output,
      a first switch coupled to a source of the first transistor and a source of the second transistor, and
      a first current source coupled to the switch and a first supply voltage;
   a plurality of second branches, wherein each of the second branches includes:
      a third transistor receiving a third signal at its gate, wherein a drain of the third transistor is coupled to the first output,
      a fourth transistor receiving a fourth signal at its gate, wherein a drain of the fourth transistor is coupled to the second output,
      a second switch coupled to a source of the third transistor and a source of the fourth transistor, and
      a second current source coupled to the switch and a first supply voltage;
   a first resistance coupled between a second supply voltage and the first output; and
   a second resistance coupled between the second supply voltage and the second output.

11. The clock and data recovery system of claim 10, wherein the first resistance is a transistor.

12. The clock and data recovery system of claim 11, wherein the second resistance is a transistor.

13. The clock and data recovery system of claim 10, wherein the second signal is the complement of the first signal.

14. The clock and data recovery system of claim 13, wherein the third signal is offset in phase from the first signal.

15. The clock and data recovery system of claim 14, wherein the fourth signal is the complement of the third signal.

16. The clock and data recovery system of claim 1, wherein the phase interpolator comprises:
   a voltage integrator;
   a plurality of first branches, wherein each of the first branches includes:
      a first transistor receiving a first signal at its gate, wherein a drain of the first transistor is coupled to a first output,
      a second transistor receiving a second signal at its gate, wherein a drain of the second transistor is coupled to a second output,
      a first switch coupled to a source of the first transistor and a source of the second transistor, and
      a first current source coupled to the switch and a first supply voltage; and
   a plurality of second branches, wherein each of the second branches includes:
      a third transistor receiving a third signal at its gate, wherein a drain of the third transistor is coupled to the first output,
      a fourth transistor receiving a fourth signal at its gate, wherein a drain of the fourth transistor is coupled to the second output,
      a second switch coupled to a source of the third transistor and a source of the fourth transistor, and
      a second current source coupled to the switch and a first supply voltage.

17. The clock and data recovery system of claim 16, wherein the voltage integrator comprises:
   a fifth transistor, wherein a source of the fifth transistor is coupled to the second supply voltage and a drain of the fifth transistor is coupled to the first output;
   a first resistance coupled between the second supply voltage and the first output;
   a first capacitor coupled between the second supply voltage and the first output;
   a second capacitor coupled between the second supply voltage and the second output;
   a second resistance coupled between the second supply voltage and the second output; and
   a sixth transistor, wherein a source of the sixth transistor is coupled to the second supply voltage and a drain of the sixth transistor is coupled to the second output,
   wherein a gate of the fifth transistor and a gate of the sixth transistor are coupled to a biasing voltage.

18. The clock and data recovery system of claim 16, wherein the first resistance is a transistor.

19. The clock and data recovery system of claim 16, wherein the second resistance is a transistor.

20. The clock and data recovery system of claim 16, wherein the second signal is the complement of the first signal.

21. The clock and data recovery system of claim 20, wherein the third signal is offset in phase from the first signal.

22. The clock and data recovery system of claim 21, wherein the fourth signal is the complement of the third signal.

23. A method for time varying gain adjustment in a clock and data recovery system, comprising:
   (a) detecting a start of a preamble associated with an incoming data stream;
   (b) setting the value of a system gain to an initial value;
   (c) applying the system gain value to a phase adjustment signal for at least one cycle;
   (d) determining whether the value of the system gain equals the value of a final gain for the system;
   (e) if it is determined that the system gain equals the final gain, applying the final gain value to the phase adjustment signal for the remaining cycles; and
   (f) if it is determined that the system gain does not equal the final gain, reducing the value of the system gain.

24. The method of claim 23, further comprising:
repeating steps (c), (d), and (e) until the system gain equals the final gain.

25. The method of claim 23, wherein the initial gain is the maximum gain acceptable for the clock and data recovery system.

26. The method of claim 23, wherein the value that the gain is reduced in step (f) is based on the number of elapsed clock cycles.

27. The method of claim 23, wherein step (f) comprises:
accessing a data structure based on an elapsed number of cycles; and
retrieving the value of the system gain.

28. The method of claim 23, further comprising, prior to step (c):
determining whether a meta-stability condition is occurring;
if a meta-stability condition is occurring,
configuring the phase adjustment signal to cause the clock and data recovery system to transition from the meta-stability condition; and
if no meta-stability condition is occurring,
configuring the phase adjustment signal to represent the phase difference of sampled signals.

29. The method of claim 28, wherein the step of determining whether a meta-stability condition is occurring comprises:
accessing data associated with the values of the sampled signals.

30. The method of claim 28, further comprising:
if a meta-stability condition is occurring:
setting the value of the system gain to a recovery value.

31. The method of claim 30, wherein the recovery value is the maximum gain acceptable for the clock and data recovery system.

32. A phase interpolator comprising:
a plurality of first branches, wherein each of the first branches includes:
a first transistor receiving a first signal at its gate, wherein a drain of the first transistor is coupled to a first output,
a second transistor receiving a second signal at its gate, wherein a drain of the second transistor is coupled to a second output,
a first switch coupled to a source of the first transistor and a source of the second transistor, and
a first current source coupled to the switch and a first supply voltage;
a plurality of second branches, wherein each of the second branches includes:
a third transistor receiving a third signal at its gate, wherein a drain of the third transistor is coupled to the first output,
a fourth transistor receiving a fourth signal at its gate, wherein a drain of the fourth transistor is coupled to the second output,
a second switch coupled to a source of the third transistor and a source of the fourth transistor, and
a second current source coupled to the switch and a first supply voltage; and
a voltage integrator, wherein the voltage integrator includes:
a fifth transistor, wherein a source of the fifth transistor is coupled to a second supply voltage and a drain of the fifth transistor is coupled to the first output,
a first resistance coupled between the second supply voltage and the first output,
a first capacitor coupled between the second supply voltage and the first output,
a second capacitor coupled between the second supply voltage and the second output,
a second resistance coupled between the second supply voltage and the second output, and
a sixth transistor, wherein a source of the sixth transistor is coupled to the second supply voltage and a drain of the sixth transistor is coupled to the second output,
wherein a gate of the fifth transistor and a gate of the sixth transistor are coupled to a biasing voltage.

33. The phase interpolator of claim 32, wherein the first transistor, the second transistor, the third transistor, and the fourth transistor are NMOS transistors.

34. The phase interpolator of claim 32, wherein the first resistance is a transistor.

35. The phase interpolator of claim 32, wherein the second resistance is a transistor.

36. The phase interpolator of claim 32, wherein the current sources are weighted.

37. The clock and data recovery system of claim 32, wherein the second signal is the complement of the first signal.

38. The clock and data recovery system of claim 37, wherein the third signal is offset in phase from the first signal.

39. The clock and data recovery system of claim 38, wherein the fourth signal is the complement of the third signal.

40. A method for meta-stability resolution, comprising:
determining whether a meta-stability condition is occurring;
if a meta-stability condition is occurring,
generating a phase adjustment signal to cause a clock and data recovery system to transition from the meta-stability condition,
setting the value of a system gain to a recovery value, and
applying the system gain to the phase adjustment signal for one or more cycles; and
if no meta-stability condition is occurring,
generating the phase adjustment signal to represent a phase difference of sampled signals.

41. The method of claim 40, wherein the step of determining whether a meta-stability condition is occurring comprises:
accessing data associated with the values of the sampled signals.

42. The method of claim 40, further comprising the steps of:
determining whether the value of the system gain equals the value of a final gain for the system;
if it is determined that the system gain equals the final gain, applying the final gain value to the phase adjustment signal for the remaining cycles; and
if it is determined that the system gain does not equal the final gain, reducing the value of the system gain.

43. A system comprising:
a phase interpolator, wherein the phase interpolator includes:
a plurality of first branches, wherein each of the first branches has:
a first transistor receiving a first signal at its gate, wherein a drain of the first transistor is coupled to a first output,
a second transistor receiving a second signal at its gate, wherein a drain of the second transistor is coupled to a second output, a first switch coupled to a source of the first transistor and a source of the second transistor, and a first current source coupled to the switch and a first supply voltage;

a plurality of second branches, wherein each of the second branches includes:

a third transistor receiving a third signal at its gate, wherein a drain of the third transistor is coupled to the first output, a fourth transistor receiving a fourth signal at its gate, wherein a drain of the fourth transistor is coupled to the second output, a second switch coupled to a source of the third transistor and a source of the fourth transistor, and a second current source coupled to the switch and a first supply voltage;

a first resistance coupled between a second supply voltage and the first output; and a second resistance coupled between the second supply voltage and the second output; and an integrator coupled to the phase interpolator, wherein the integrator comprises:

a first differential pair circuit including a first differential pair transistor and a second differential pair transistor, wherein a drain of the first differential pair transistor is coupled to a first output and a drain of the second differential pair transistor is coupled to a second output;

a first capacitive and resistive feedback portion, wherein the first capacitive and resistive feedback portion includes:

a first resistor coupled to a first input and to a gate of the first differential transistor, wherein the first input receives a first voltage, a second resistor coupled to the gate and drain of the first differential transistor, and a first capacitor coupled to the gate and drain of the first differential transistor;

a second capacitive and resistive feedback portion, wherein the second capacitive and resistive feedback portion includes:

a third resistor coupled to a second input and to a gate of the second differential transistor, wherein the second input receives a second voltage, a fourth resistor coupled to the gate and drain of the second differential transistor, and a second capacitor coupled to the gate and drain of the second differential transistor;

a fifth resistance coupled to a first supply voltage and the drain of the first differential transistor;

a sixth resistance coupled to the first supply voltage and the drain of the second differential transistor; and a current source coupled to the source of the first differential transistor, the source of the second differential transistor, and a second supply voltage.

44. The system of claim 43, wherein the system is a clock and data recovery system.

45. The system of claim 43, wherein the system is a frequency synthesis circuit.

46. The system of claim 43, wherein the system is an IQ modulator.

* * * * *